United States Patent [19]

Walber

[11] 4,389,583
[45] Jun. 21, 1983

[54] CAPACITANCE SWITCH DETECTION CIRCUITRY

[75] Inventor: James P. Walber, Cedar Grove, Wis.

[73] Assignee: W. H. Brady Co., Milwaukee, Wis.

[21] Appl. No.: 271,398

[22] Filed: Jun. 8, 1981

[51] Int. Cl.³ .................... H03K 9/06; H03K 17/18
[52] U.S. Cl. .................... 307/522; 307/246; 328/138
[58] Field of Search .......... 307/522, 271, 246; 328/138

[56] References Cited

U.S. PATENT DOCUMENTS

| | | | |
|---|---|---|---|
| 3,305,732 | 2/1967 | Grossman et al. | 328/138 |
| 3,943,382 | 3/1976 | Hermansdorfer et al. | 307/522 |
| 3,968,447 | 7/1976 | Baylac et al. | 307/271 |
| 3,971,959 | 7/1976 | Flournoy | 307/522 |

*Primary Examiner*—John S. Heyman

[57] ABSTRACT

Detection circuitry for a capacitance switch including a source of two-state electrical pulses that are supplied to two clock nodes 180° out of phase, a buffer connected to one of the switch connection nodes, means between the clock nodes and the switch connections to maintain the buffer input at one condition when the capacitance switch is closed and to cause the buffer input conditions and the buffer output signal to vary with the two-state pulses when the capacitance switch is open, and a frequency detector connected to the buffer output.

7 Claims, 2 Drawing Figures

CAPACITANCE SWITCH DETECTION CIRCUITRY

FIELD OF THE INVENTION

The invention relates to detection circuitry for capacitance-type switches.

BACKGROUND OF THE INVENTION

In a capacitance-type switch a movable key acts to increase capacitance, and the change in capacitance is then sensed for switching action. Commercially available capacitance switches typically involve changes in capacitance on the order of one to two. The pulses generated by the change in capacitance are typically of short (i.e., nanosecond) duration and are small in amplitude and must be amplified. Also, because the pulses are small, means must be taken to shield noise from external sources.

Prior to the conception of my invention claimed herein, Norman J. Frame invented a capacitance switch construction (FIG. 1) having a capacitance spacer layer of large area to achieve a large difference between unactuated and actuated capacitances, for a greater signal-to-noise ratio. My attempts to practicably sense activation and deactivation of this switch by connecting it to ground and a D.C. source via a pair of resistors and gates to sense voltage changes were frustrated by the amount of time required to discharge the charged capacitor after releasing the switch.

SUMMARY OF THE INVENTION

In general the invention features capacitance switch detection circuitry including a source of two-state electrical pulses that are supplied to two clock nodes 180° out of phase, a buffer connected to one of the switch connection nodes that has output signal depending upon its input condition relative to a threshold value, means connected between the clock nodes and switch connection nodes to maintain the buffer input at a condition relative to its threshold value when the capacitance switch is closed and to cause the buffer input condition and buffer output signal to vary with the two-state pulses when the capacitance switch is open, and a frequency detector connected to the buffer output. When the switch is open, the impedance between the switch connections is too high to significantly reactively couple them, and the two-state pulses appear at the buffer input and cause a changing buffer output that is detected by the frequency detector, indicating that the switch is open. When the switch is closed, the capacitance of the switch increases and the impedance is lowered such that the buffer input stays either above or below the threshold value, thereby maintaining a constant buffer output indicating that the switch is closed. When the switch is released (i.e., open; high impedance), the two-state pulses are immediately detected by the frequency detector, quickly indicating that the switch is open.

In preferred embodiments the elements maintaining the buffer input conditions while the switch is closed and causing a varied buffer output when the switch is open are a high-impedance path and a unidirectional low-impedance path connected in parallel between each clock node and its corresponding switch connection node (one unidirectional path permitting current flow to the switch and the other permitting current flow away from the switch); the frequency detector is a resistor connected at one end to the output of the buffer and at its other end to a gate input, a capacitor and means for draining the capacitor when the output signal of the buffer is low; the high impedance paths are resistors and the low impedance paths are diodes; the means for draining the capacitor is a diode connected to the buffer output; there is a plurality of switching elements in a row in the switch, and the circuit contains a separate switch connection node, buffer, buffer input control means and frequency detector for each switching element in the row; and the switch includes a plurality of rows of switching elements, and there is a separate switch connection, buffer, buffer input control means and frequency detector for each row of switching elements.

Such a circuit provides a relatively simple and reliable indication of switch activation. The indication is continuous while the switch is activated and is stopped immediately upon deactivation of the switch, and the circuit can be reactivated to sense another switch activation immediately following deactivation.

DESCRIPTION OF THE PREFERRED EMBODIMENT

The structure and operation of the presently preferred embodiment of the invention will now be described after first briefly describing the drawings.

Drawings

STRUCTURE

Figure 1:
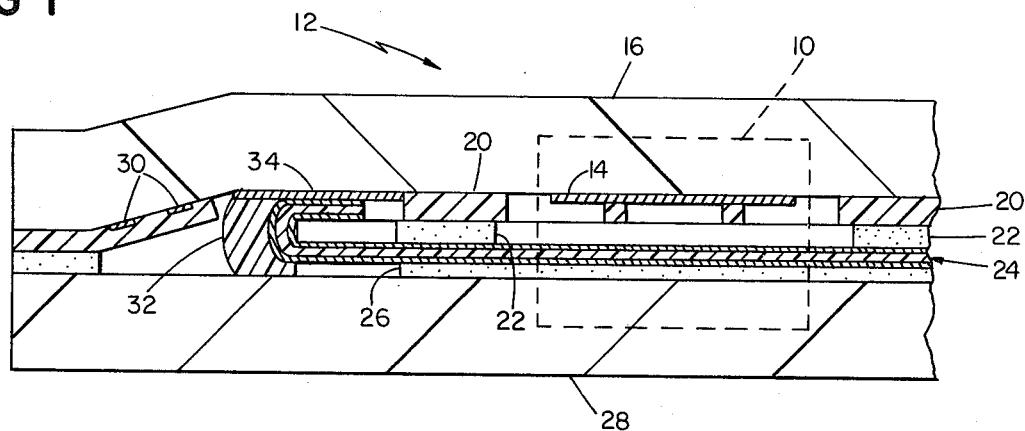
FIG. 1 is a vertical sectional view, partially broken away and taken through a switching element, of a multilayered, flexible capacitance switch invented by Norman Frame.

Referring to FIG. 1, there is shown switching element 10 (within the dotted lines) of a capacitance switch 12 having three rows and four columns of such elements, which switch's construction is described in detail in U.S. patent application Ser. No. 228,118, which is hereby incorporated by reference. Switching element 10 includes round conductive pad 14, vacuum deposited on the lower surface of polyester layer 16. On the bottom surface of layer 16 and pads 14 is cured epoxy layer 20, which is interrupted in the switching element region to leave the majority of the lower surface of pad 14 exposed. Adhered therebelow by adhesive layer 22 is elongated strip 24, consisting of ¼ mil thick polyester with RF sputtered layers of aluminum on the upper and lower surfaces. The bottom surface of strip 24 is attached by adhesive layer 26 to bottom polyester layer 28. Pad 14 is connected by one of conductors 30, and the lower aluminum surface is connected by conductive epoxy 32 and conductor 34, to a tail for connection to the FIG. 2 circuitry.

Figure 2:
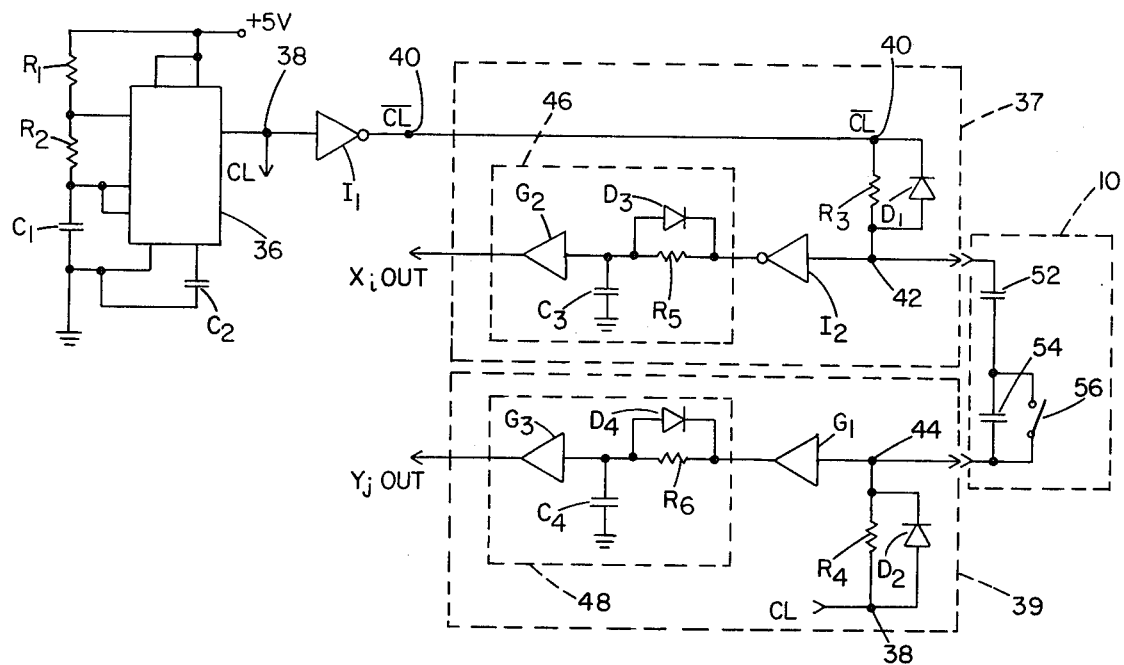
FIG. 2 is an electrical schematic of detection circuitry according to the invention connected to a capacitance switch.

Referring to the FIG. 2 circuit diagram, clock 36 is shown connected by subcircuits 37, 39 to an equivalent circuit for switching element 10. One subcircuit 37 is provided for each row of switching elements 10, and one subcircuit 39 is provided for each column of switching elements 10. Thus, for the three by four matrix switch of the above described patent application, three subcircuits 39 and four subcircuits 37 are connected to clock nodes 38, 40 for twelve switching elements 10.

The outputs indicate the row, $X_i$, and the column, $Y_j$, of the element 10 which is activated.

Clock 36 and its associated resistors $R_1$, $R_2$ and capacitors $C_1$, $C_2$ provide a square wave clock signal (CL) at approximately a 5 kHz frequency and a 50% duty cycle to node 38. Node 38 is connected to the input of inverter gate $I_1$, whose output is connected to clock node 40. Node 40 is connected to switch connection node 42 by resistor $R_3$ and diode $D_1$, connected to permit current flow from switch connection node 42 to clock node 40. Node 38 is similarly connected to switch connection node 44 by resistor $R_4$ and diode $D_2$; however, diode $D_2$ is connected to permit current flow to the switch from node 38, and not away from it as with diode $D_1$. Switch connection node 42 is connected to the input of inverter gate $I_2$, whose output is connected to frequency deetector 46. Frequency detector 46 includes diode $D_3$ and resistor $R_5$, which connect in parallel the output of inverter gate $I_2$, with detecting capacitor $C_3$ and the input of gate $G_2$. Switch connection 44 is similarly connected to identical frequency detector 48 by gate $G_1$.

The equivalent circuit for switching element 10 includes polyester capacitor 52 (the aluminum layers separated by a polyester layer in elongated strip 24), air capacitor 54 (pad 14 and the upper aluminum layer of strip 24 separated by air), and switch 56, which short circuits air capacitor 54 when pad 14 is depressed to contact the upper aluminum surface of strip 24. Switching element 10 provides a 30 picofarad capacitance when it is open (pad 14 raised; switch 56 open) and a 10 nanofarad capacitance when it is closed (pad 14 lowered; switch 56 closed).

The components used in the FIG. 2 circuit are as follows:

| | |
|---|---|
| clock 36 | 555 |
| $I_1$, $I_2$ | 4049 |
| $G_1$, $G_2$, $G_3$ | 4050 |
| $R_1$ | .33 k ohm |
| $R_2$ | 150 k ohms |
| $R_3$, $R_4$ | 47 k ohms |
| $R_5$, $R_6$ | 470 k ohms |
| $D_1$, $D_2$, $D_3$, $D_4$ | IN4148 |
| $C_1$, $C_3$, $C_4$ | .001 $\mu$farad |
| $C_2$ | .01 $\mu$farad |

OPERATION

In operation, clock 36 provides a 5 kHz, 50% duty cycle clock signal CL to clock node 38, and inverter $I_1$, converts this to a signal, $\overline{CL}$, which is 180° out of phase with CL at clock node 40.

First taking the case when the switching element is in its deactivated condition (i.e., switch 56 is open), switch connection nodes 42, 44 are not significantly reactively coupled because of the large size of the switch impedance, $1.06 \times 10^6 \Omega$. Thus both switch connection nodes 42, 44 and the inputs to inverter $I_2$ and gate $G_1$ see the 5 kHz frequency, and the output signals of inverter $I_2$ and gate $G_1$ are square waves, which are detected by frequency detectors 46, 48, which in turn provide low signals at the outputs of gates $G_2$, $G_3$. Owing to the short period of the 5 kHz frequency (0.2 msec) and the time constant for the $R_5C_3$ and $R_6C_4$ networks (0.47 msec), the detecting capacitors $C_3$, $C_4$ do not charge up to the threshold voltage necessary to turn gates $G_2$, $G_3$ on when the output signals of inverter $I_2$ and gate $G_1$ are high. When the output signals of inverter $I_2$ and gate $G_1$ go to low, capacitors $C_3$, $C_4$ are discharged through diodes $D_3$, $D_4$. Thus, throughout the time when switching element 10 is open, gates $G_2$, $G_3$ provide low outputs indicating that the switch at row i and column j is open.

When the switching element is in its activated condition (i.e., switch 56 is closed), its impedance is $3.18 \times 10^3 \Omega$, a value small enough to reactively couple switch connection nodes 42, 44. When clock node 38 (CL) is high, and node 40 ($\overline{CL}$) is low, all voltage drop between the nodes is in capacitor 52 (diodes $D_1$, $D_2$ provide low impedance paths bypassing resistors $R_3$, $R_4$), and switch connection node 42 is low and connection node 44 is high, causing high output signals from inverter $I_2$ and gate $G_1$. When the clock signal changes state, node 38 is low, and node 40 is high, and current limiting resistors $R_3$, $R_4$ are not preempted by diodes $D_1$, $D_2$. Because the upper plate has been charged from the preceeding cycle, switch connection 42 would go below ground, except this is prevented by the internal protection diodes in inverter $I_2$ connected to its input. Resistor $R_4$ limits the discharge of capacitor 52 while node 38 is low; the voltage ramps down somewhat from the "high" level, but does not go below the threshold for $G_1$ owing to the time constant for the capacitor and resistors and the period of the square wave cycle. Thus, the output signals from gate $G_1$ and inverter $I_2$ remain high. When the state of the square wave is reversed once again, diodes $D_1$, $D_2$ are forward biased once again, and capacitor 52 is charged up once again.

It is seen that the unidirectional low impedance diodes $D_1$, $D_2$ drive the switch connection nodes to low and high conditions during one state of the square wave, and the high impedance resistors limit the change in voltage at switch connection nodes during the other state of the square wave such that the input of gate $G_1$ is always above its threshold and the input of inverter $I_2$ is always below its threshold. The output signals of gate $G_1$ and inverter $I_2$ thus remain high while switch 56 is closed, and they act as buffers to the small changes in voltage occurring at the switch connection nodes. Because the output signals of inverter $I_2$ and gate $G_1$ remain high, capacitors $C_3$, $C_4$ are charged above the threshold voltage for the inputs to gates $G_2$, $G_3$, whose outputs, $X_i$, $Y_j$, are high indicating that the switching element is depressed.

When switch 56 is opened (i.e., the switch element is in its deactivated condition with pad 14 raised and not contacting the upper aluminum layer of strip 24), the square wave will be applied to switch connection nodes 42, 44 and frequency detectors 46, 48. Detecting capacitors $C_3$ and $C_4$ then discharge when the outputs of inverter $I_2$ and gate $G_1$ go low causing diodes $D_3$, $D_4$ to be forward biased. The output signals of gates $G_2$, $G_3$ are then low indicating that the switch is deactivated.

OTHER EMBODIMENTS

Other embodiments within the appended claims will be apparent to those in the art. For example any number of rows or columns could be used; if just one row is used, there is no need for an entire subcircuit 37; resistor $R_3$, diode $D_1$, and switch connection node 42 are all that is needed. Also, besides resistors $R_3$, $R_4$, other components can be used to provide high impedance paths, and besides diodes $D_1$, $D_2$, other components can be used to provide low-impedance, unidirectional paths, between nodes 38, 40 and switching connections 44, 42. Similarly, other components can be used for frequency detectors 46, 48, and besides inverter I₂ and G₁, other components can be used to provide buffers for the frequency detectors. Finally, the circuit design can be used with a capacitance switch having different capacitances from the disclosed switch so long as the switch capacitances, clock signal, and circuit components ae such that when the switch is in one condition, the clock signals pass through the buffers to the frequency detectors, and when the switch is in another condition, the buffers provide constant output signals.

What is claimed is:

1. Detection circuitry for a capacitance switch having one capacitance value in an activated condition and a different capacitance value in a deactivated condition, the circuitry comprising
   a source suppling a first clock node and a second clock node with two-state electrical pulses 180° out of phase,
   first and second switch connection nodes for connecting a switching element in said capacitance switch to said circuitry,
   a buffer having an input connected to said first switch connection node, and providing an output signal depending upon the condition at said buffer input relative to a threshold value,
   means connected between said clock nodes and said switch connection nodes for responding to the capacitance associated with one condition of said switch by maintaining said buffer input at a condition relative to said threshold value of said buffer and for responding to a capacitance associated with another condition of said switch by permitting the condition at said buffer input to vary sufficiently to cause the output of said buffer to vary with said two-state pulses, and
   a frequency detector connected to said buffer, to determine which condition said capacitance switch is in.

2. The circuitry of claim 1 wherein said means connected between said clock nodes and switch connection nodes comprises
   a first high impedance path between said first clock node and said first switch connection node,
   a second high impedance path between said second clock node and said second switch connection node,
   a first unidirectional, low impedance path between said first clock node and said first switch connection node,
   and
   a second unidirectional, low impedance path between said second clock node and said second switch connection node,
      one said low impedance path permitting current flow to its respective switch connection node and the other said low impedance path permitting current flow away from the other said switch connection node.

3. The circuitry of claim 2 wherein said frequency detector comprises
   a resistor connected at one end to an output of said buffer and at the other end to a gate input, a detecting capacitor, and means for draining said capacitor when the output signal of said buffer is low.

4. The circuitry of claim 3 wherein said high impedance paths are resistors and said unidirectional low impedance paths are diodes.

5. The circuitry of claim 3 or 4 wherein said means for draining is a diode connected to said buffer output.

6. The circuitry of claim 1 wherein said switch contains a row with a plurality of switching elements, each having a conductive pad electrically common with pads of the other switches and a pad having its own conductor isolated from conductors for other switching elements, and said circuit contains a first switch connection, buffer, means connected between clock nodes and switch connection nodes, and frequency detector for each said switching element in said row.

7. The circuitry of claim 6 wherein said switch includes a plurality of rows of said switching elements resulting in an X by Y matrix of switching elements, and said circuit contains a second said switch connection, a buffer, means connected between clock nodes and switch connection nodes, and a frequency detector for each said row.

* * * * *